US008796775B2

(12) United States Patent
Kim

(10) Patent No.: US 8,796,775 B2
(45) Date of Patent: Aug. 5, 2014

(54) ELECTRO-STATIC DISCHARGE PROTECTION DEVICE

(75) Inventor: Tae-hoon Kim, Suwon-si (KR)

(73) Assignee: Magnachip Semiconductor Ltd., Cheongju-si (KR)

( * ) Notice: Subject to any disclaimer, the term of this patent is extended or adjusted under 35 U.S.C. 154(b) by 141 days.

(21) Appl. No.: 13/349,694

(22) Filed: Jan. 13, 2012

(65) Prior Publication Data

US 2013/0001686 A1    Jan. 3, 2013

(30) Foreign Application Priority Data

Jul. 1, 2011    (KR) .................. 10-2011-0065609

(51) Int. Cl.
*H01L 23/62*    (2006.01)
*H01L 27/02*    (2006.01)
*H01L 29/78*    (2006.01)
*H01L 29/10*    (2006.01)

(52) U.S. Cl.
CPC .............. *H01L 29/78* (2013.01); *H01L 27/027* (2013.01); *H01L 29/1087* (2013.01)
USPC .......................................... 257/355; 257/321

(58) Field of Classification Search
CPC ................................ H01L 27/00; H01L 29/00
USPC .................................................. 257/355, 321
See application file for complete search history.

(56) References Cited

U.S. PATENT DOCUMENTS

| 7,005,708 | B2 | 2/2006 | Mergens et al. | |
|---|---|---|---|---|
| 7,646,063 | B1 | 1/2010 | Boyd et al. | |
| 2008/0211028 | A1* | 9/2008 | Suzuki | 257/360 |
| 2011/0254074 | A1* | 10/2011 | Anezaki | 257/321 |

\* cited by examiner

*Primary Examiner* — Telly Green
(74) *Attorney, Agent, or Firm* — NSIP Law

(57) ABSTRACT

An Electro-Static Discharge (ESD) protection device is provided. The ESD protection device includes a metal-oxide semiconductor (MOS) transistor, including a source area having a surface on which a first silicide is formed, the source area including a source connecting area including a first connecting portion formed on the first silicide, and a source extension area, a gate arranged in parallel with the source area, and a drain area arranged in parallel with the source area and the gate, the drain area having a surface on which a second silicide is formed, the drain area including a drain connecting area formed opposite the source extension area, the drain connecting area including second connection portion formed on the second silicide, and a drain extension area formed opposite the source connecting area.

19 Claims, 16 Drawing Sheets

ELECTRO-STATIC DISCHARGE PROTECTION DEVICE

CROSS-REFERENCE TO RELATED APPLICATIONS

This application claims the benefit under 35 U.S.C. §119(a) from Korean Patent Application No. 10-2011-0065609 filed on Jul. 1, 2011 in the Korean Intellectual Property Office, the entire disclosure of which is incorporated herein by reference for all purposes.

BACKGROUND

1. Field

The following description relates to an Electro-Static Discharge (ESD) protection device, and, for example, to an ESD protection device protecting an internal circuit from an ESD stress current.

2. Description of the Related Art

Generally, an ESD protection circuit is disposed between an internal circuit and an input pad, an output pad, an electric power pad, and a ground pad of a semiconductor device for preventing the internal circuit from being damaged by an ESD stress current that flows into the semiconductor device from a charged human body or machinery.

Depending on a degree of integration according to a system on chip, an area that the ESD protection device occupies accounts for a large proportion for determining an entire size of a semiconductor chip. In addition, since the ESD protection circuit serves as an important factor to determine the performance of chips, the ESD protection circuit is becoming increasingly important.

In many cases, the ESD protection device uses a Gate Grounded N-type Metal Oxide Semiconductor (GGNMOS) field effect transistor of which a gate, a source, and a bulk are formed in one connection and then the one connection is connected to a ground voltage node of Vss. A ground line Vss and an electric power line Vdd are connected to the source and a drain via contacts, respectively. At this time, normally, the contacts are arranged within the drain and source areas, and silicides are formed around the contacts to decrease a contact resistance.

As there is a desire for the shrinking of a semiconductor chip, when the electric power line and the ground line are arranged over the GGNMOS for reducing an area on which the electric power line and the ground line are formed, the contacts are arranged only at some areas of the source and drain, and the silicide are formed around the contacts, current paths are formed only between the contacts which face each other and have a minimum distance.

Accordingly, since the ESD stress current is concentrated on a specific contact so that the ESD protection device is easily destroyed, the ESD stress current does not smoothly discharge from the semiconductor chip. Therefore, the level of the ESD protection device is lowered.

SUMMARY

In one general aspect, there is provided an Electro-Static Discharge (ESD) protection device, including a metal-oxide semiconductor (MOS) transistor, including a source area having a surface on which a first silicide is formed, the source area including a source connecting area including a first connecting portion formed on the first silicide, and a source extension area, a gate arranged in parallel with the source area, and a drain area arranged in parallel with the source area and the gate, the drain area having a surface on which a second silicide is formed, the drain area including a drain connecting area formed opposite the source extension area, the drain connecting area including second connection portion formed on the second silicide, and a drain extension area formed opposite the source connecting area.

The general aspect of the ESD protection device may further provide a first metal portion and a second metal portion that are spaced apart from a surface of the MOS transistor and arranged in parallel in a direction perpendicular to an arrangement direction of the source area, the gate and the drain area. The first connecting portion is connected to the first metal portion and the second connecting portion is connected to the second metal portion.

The general aspect of the ESD protection device may further provide that the first metal portion is connected to a ground line, and the second metal portion is connected to an electric power line from which an ESD stress current is flowed in.

The general aspect of the ESD protection device may further provide that the first metal portion and the second metal portion are spaced apart from each other.

The general aspect of the ESD protection device may further provide that the first metal portion and the second metal portion are arranged on the same layer.

The general aspect of the ESD protection device may further provide that each of the first connecting portion and the second connecting portion comprises at least one contact through an insulating layer.

The general aspect of the ESD protection device may further provide that the first silicide has a first predetermined size based on a center of the source area, a portion of the source area being exposed from a boundary of the source area, and the second silicide has a second predetermined size based on a center of the drain area, a portion of the drain area being exposed from a boundary of the drain area.

The general aspect of the ESD protection device may further provide that a spacing between the second connecting portion and the gate is greater than a spacing between the first connecting portion and the gate.

The general aspect of the ESD protection device may further provide that the first connecting portion is spaced apart in a range of 0.11 μm to 1 μm from the gate, and the second connecting portion is spaced apart in a range of 1 μm to 5 μm from the gate.

The general aspect of the ESD protection device may further provide that the MOS transistor includes a gate-grounded NMOS transistor.

The general aspect of the ESD protection device may further provide that the MOS transistor includes a high voltage gate-grounded NMOS transistor.

The general aspect of the ESD protection device may further provide a first low-concentration drift area formed below the drain area, and a second low-concentration drift area formed below the source area.

The general aspect of the ESD protection device may further provide a logic well implant area being implanted below the drain area such that the logic well implant area implants a dopant into the first low-concentration drift area that has a depth that is greater than a depth of the first low-concentration drift area.

The general aspect of the ESD protection device may further provide that the logic well implant area includes a retrograde well.

The general aspect of the ESD protection device may further provide that the MOS transistor includes a multi-finger structure including at least two gates.

The general aspect of the ESD protection device may further provide that the gate includes a silicide area formed on the gate.

The general aspect of the ESD protection device may further provide that the first connecting portion is one of a plurality of first connecting portions, the first connecting portions being connected to the first metal portion, and the second connecting portion is one of a plurality of second connecting portions, the second connecting portions being connected to the second metal portion.

In another aspect, there is provided an Electro-Static Discharge (ESD) protection device, including a metal-oxide semiconductor (MOS) transistor having a source area, a gate, and a drain area arranged in parallel, a first silicide formed on a surface of the source area, a second silicide formed on a surface of the drain area, a first connecting portion formed on the first silicide, and a second connecting portion formed on the second silicide such that the second connecting portion does not face the first connecting portion. The first silicide extends to a source extension area on the source area that faces the second connecting portion, and the second silicide extends to a drain extension area on the drain area that faces the first connecting portion.

Other features and aspects may be apparent from the following detailed description, the drawings, and the claims.

Figure 1:
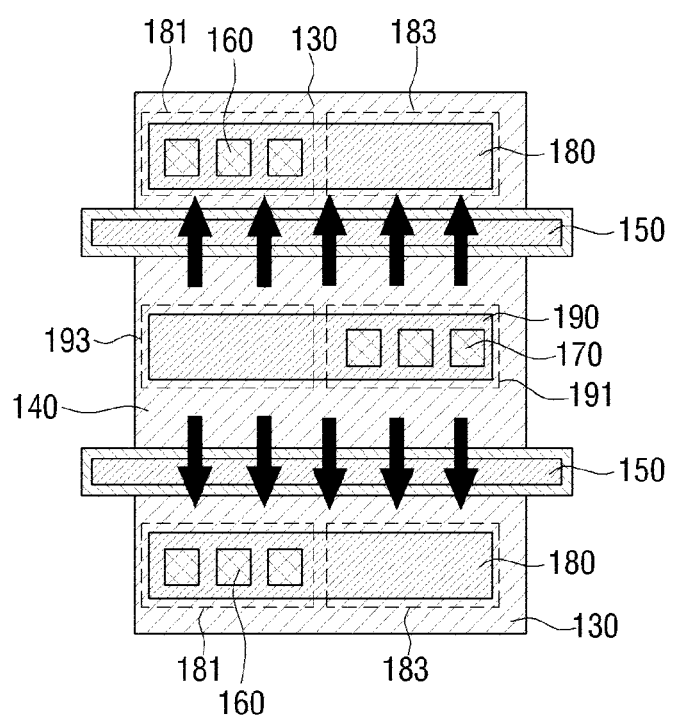
FIG. 1 is a plan view illustrating an example of a flow of an ESD stress current in an ESD protection device of a general aspect.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the apparatuses and/or systems described herein. Accordingly, various changes, modifications, and equivalents of the systems and/or apparatuses described herein will be suggested to those of ordinary skill in the art. In addition, descriptions of well-known functions and constructions may be omitted for increased clarity and conciseness.

It is understood that the features of the present disclosure may be embodied in different forms and should not be construed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

FIG. 1 is a plan view illustrating an example of a flow of an ESD stress current in an ESD protection device of a general aspect.

The ESD protection device as illustrated in FIG. 1 is used in a low voltage device having an operating voltage of a range of 1 V to 8 V, and can be used in low voltage devices having operating voltages of 1.8 V, 3.3 V and 5 V. The ESD protection device can be manufactured using the same complementary-symmetry metal-oxide-semiconductor (CMOS) process as that which is used to manufacture the low voltage device.

In FIG. 1, for convenience of explanation, a first metal portion 110 (see FIG. 2B) and a second metal portion 120 (see FIG. 2B), which are respectively connected with source areas 130 and a drain area 140, are not illustrated. The direction of the arrows in FIG. 1 represents a flow of an ESD stress current.

When the ESD stress current flows into second connecting portions 170 of the drain area 140, a bipolar junction transistor (BJT) current path is formed between the drain area 140, in which there are the second connecting portions 170, and the source areas 130, in which there are first connecting portions 160, so that the flowed ESD stress current is discharged outside via the first connecting portions 160 of the source areas 130.

At this time, if first silicides 180 are formed on the source areas 130 so as to include both source connecting areas 181 that surround the first connecting portions 160 and source extension areas 183, and a second silicide 190 is formed on the drain area 140 so as to include a drain connecting area 191 surrounding the second connecting portions 170 and a drain extension area 193, a wider BJT current path can be formed.

Since this improves a current bottleneck phenomenon between the source areas 130 and the drain area 140 to sufficiently use a width of a device formed as an active area 105, the ESD stress current can be discharged outside more easily.

Figure 2A:
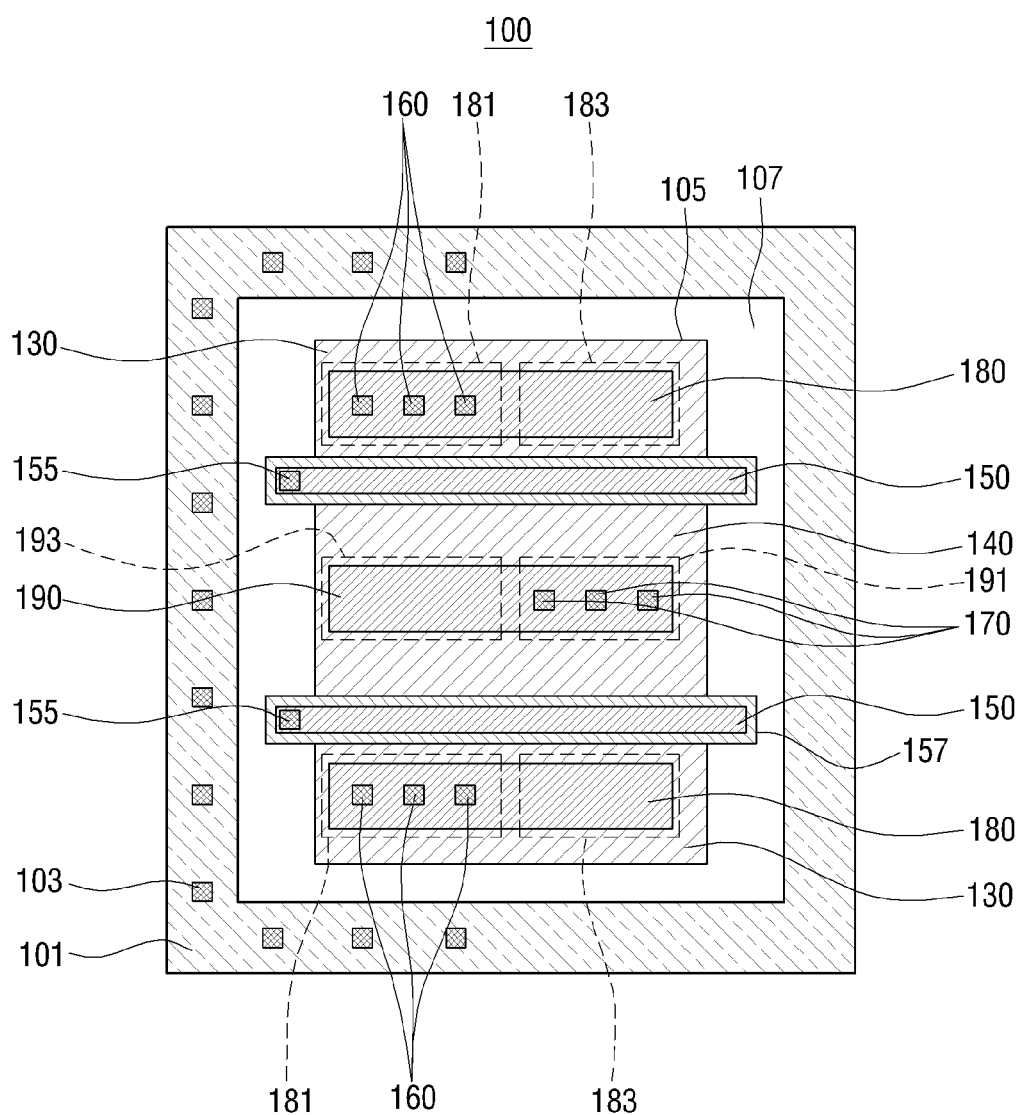
FIGS. 2A and 2B are plan views illustrating examples of an ESD protection device of a general aspect.
Figure 2B:
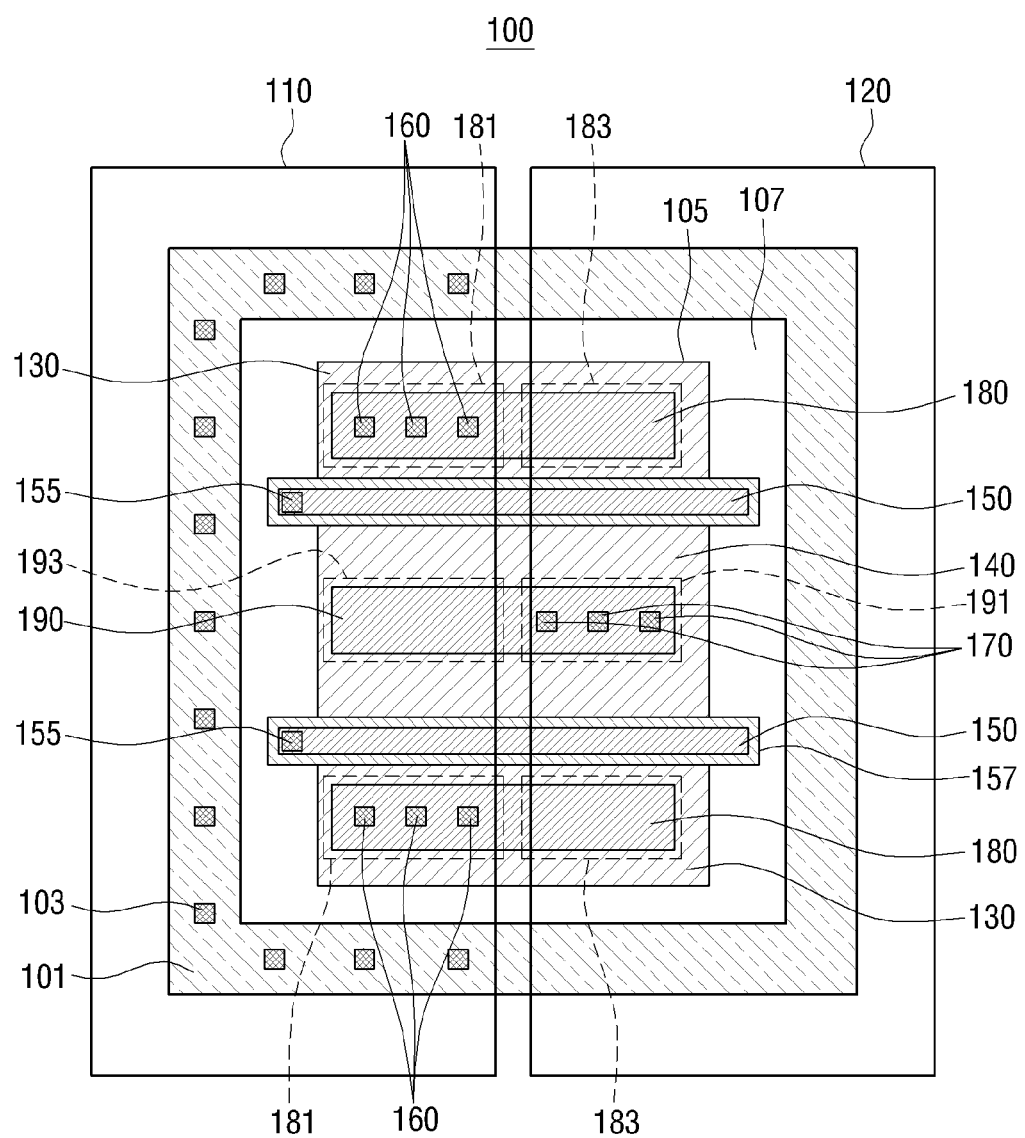

FIGS. 2A and 2B are plan views illustrating examples of an ESD protection device of a general aspect. Referring to FIG. 2A, the ESD protection device 100 may include the source areas 130, the drain area 140, gates 150, the first connecting portions 160, the second connecting portions 170, the first silicides 180, and the second silicide 190.

In addition, the ESD protection device of a general aspect may be embodied as a multi-finger shape using two or more gates.

Also, the ESD protection device may be a GGNMOS transistor. In this case, a substrate may be a general silicon substrate, and may be doped by a p-type dopant such as boron, indium, etc. The p-type dopant is ion implanted in the range of $1 \times 10^{12}$ to $1 \times 10^{14}$ ion/cm$^2$ so as to form a p-well.

The gates 150 are configured to electrically connect the doping area and may include a gate electrode (not illustrated), a gate oxide (not illustrated), a gate spacer (not illustrated), etc.

The gates 150 may be connected to the first metal portion 110 via gate contacts 155 (see FIG. 2B). Silicide areas 153 (see FIGS. 4 and 5) that reduce a contact resistance with gate contacts 155 may be formed on a surface of the gates 150.

For example, the gate contacts 155 may be placed in a portion at which the gates 150 and a shallow trench isolation (STI) area 107 are overlapped. In other words, as illustrated in FIG. 2A, the gate contacts 155 are placed at end portions of the gates 150. If the gate contacts are formed at an area at which the active area 105 and the gates 150 are overlapped, a gate leakage current may be generated.

The source areas 130 and the drain area 140 may be arranged at both sides of the gates 150, respectively. In other words, the source areas 130, the gates 150, and the drain area 140 are arranged in parallel to form a MOS transistor.

The source areas 130 are formed at one side of the gates 150 by implanting a first type of dopant in the surface of the substrate. For example, in case that the ESD protection device is a GGNMOS transistor, the source areas 130 may be formed by implanting an n-type dopant such as arsenic, phosphorus, etc., within a range of $1\times10^{14}$ ion/cm$^2$ to $1\times10^{16}$ ion/cm$^2$.

The drain area 140 is formed at the other side of the gates 150 from the source areas 130 by implanting the first type of dopant in the surface of the substrate. For example, the drain area 140 may be formed by implanting an n-type dopant such as arsenic, phosphorus, etc., within the range of $1\times10^{14}$ ion/cm$^2$ to $1\times10^{16}$ ion/cm$^2$ like the source area 130.

The first silicides 180 are formed on the surface of the source areas 130, and the second silicide 190 is formed on the surface of the drain area 140.

The first silicides 180 may be formed to have a predetermined size based on a center of the source areas 130 so that a predetermined portion of the source areas 130 is exposed from a boundary of the source areas 130. In addition, the second silicide 190 may be formed to have a predetermined size based on a center of the drain area 140 so that a predetermined portion of the drain area 140 is exposed from a boundary of the drain area 140.

The first connecting portions 160 are formed on the first silicides 180 and are connecting portions for source contacts to electrically connect the source areas 130 and the metal wiring (the first metal portion 110 in FIG. 2B). The second connecting portions 170 are formed on the second silicide 190 and are connecting portions for drain contacts to electrically connect the drain area 140 and the metal wiring (the second metal portion 120 in FIG. 2B).

For example, each of the first connecting portions 160 and the second connecting portions 170 may be formed on a portion of each of the first silicides 180 and the second silicide 190.

In addition, the second connecting portions 170 may be formed on the second silicide 190 in such a way as to avoid opposing the first connecting portions 160.

For example, as illustrated in FIG. 2A, the first connecting portions 160 and the second connecting portions 170 are not formed to correspond with each other based on the gates 150. The first connecting portions 160 and the second connecting portions 170 are formed so that the first connecting portions 160 and the second connecting portions 170 do not face each other. Due to this structure, the first connecting portions 160 and the second connecting portions 170 may be formed by using one metal layer (see FIG. 2B).

However, if the first connecting portions 160 and the second connecting portions 170 are formed to face each other on the first silicides 180 and the second silicide 190, a layout with respect to the metal is changed. As a result of this, the metal layout as illustrated in FIG. 2B cannot be used and a broader area is needed.

The first silicides 180 may include the source connecting areas 181 surrounding the first connecting portions 160 and the source extension areas 183 in which the first connecting portions 160 are not formed. The second silicide 190 may include drain connecting area 191 surrounding the second connecting portions 170 and a drain extension area 193 in which the second connecting portions 170 are not formed.

In other words, the first silicides 180 are formed to extend to an area facing the second connecting portions 170 on the source areas 130, and the second silicide 190 is formed to extend to an area facing the first connecting portions 160 on the drain area 140.

As described above, the source and drain extension areas 183 and 193 are formed in order to minimize an area that the metal occupies and to arrange the metal layout on one layer.

In addition, even if the source and drain extension areas 183 and 193 do not have the first and second connecting portions 160 and 170, the silicide reduces the electric resistance to form a wider current path between the source areas 130 and the drain area 140. In other words, when the ESD stress current enters the second connecting portions 170 via the second metal portion 120, the high ESD stress current needs to be quickly transmitted to the source areas 130. The current is, thus, quickly diffused from the drain area 140 to the source areas 130 by the silicide having a low resistance.

Although the drain extension area 193 has none of the second connecting portions 170, the ESD stress current is spread to the drain extension area 193 having a low resistance and is transmitted to the source areas 130 in which the first connecting portions 160 are formed via a bottom end of the gate. By doing so, the ESD stress current is quickly discharged to the ground line via the first connecting portions 160.

Likewise, the ESD stress current is quickly transmitted from the second connecting portions 170 to the source extension areas 183 including the first silicides 180 for the source in which the first connecting portions 160 are not formed. Then, the ESD stress current is easily transmitted to the first connecting portions 160 via the low resistance silicide. Further, the ESD stress current is discharged via the ground line connected with the first connecting portions 160. As described above, although the first and second connecting portions 160 and 170 are not formed, the ESD stress current is quickly transmitted to the ground line by the source extension areas 183 including the first silicides 180 having a low resistance. As a result, the source extension areas 183 including the first silicides 180 may be formed to have a low resistance.

Here, the first silicides 180 formed in the source connecting areas 181 surrounding the first connecting portions 160 reduce a contact resistance between the substrate and the first connecting portions 160. Further, the second silicide 190 formed in the drain connecting area 191 surrounding the second connecting portions 170 reduces a contact resistance between the substrate and the second connecting portions 170.

On the other hand, a Source Contact to Gate Spacing (SCGS) between the first connecting portions 160 and the gates 150 is smaller than a Drain Contact to Gate Spacing (DCGS) between the second connecting portions 170 and the gates 150. For example, the spacing between the first connecting portions 160 and the gates 150 may be in a range of 0.11 μm to 1 μm, and the spacing between the second connecting portions 170 and the gates 150 may be in a range of 1 μm to 5 μm.

The DCGS is formed to be larger than the SCGS in order to increase a ballast resistance of the drain area 140. By doing so, a slope from a holding voltage $V_{11}$ to a voltage $V_{12}$ in which a thermal failure occurs may be gentle. A multi-fingers structure using two or more gates may be formed as was previously referenced.

When the ballast resistance is increased, the drains can be operated in order and the ESD stress current entering the drains can be quickly diffused to many areas.

If the DCGS is narrowed, the ballast resistance is reduced. As a result, since a voltage of each of a plurality of drain areas cannot be sequentially increased so that each of the drain areas is not sequentially turned on to operate, one drain receives the ESD stress current. If so, the desired BJT current characteristics cannot be obtained, thereby requiring that one drain to process the current.

However, the size of each of the first silicides 180 and the second silicide 190 may be changed according to a minimum design rule of the CMOS design standard.

The first and second silicides 180 and 190 may be formed by using a silicon oxide blocking layer or a silicon nitride blocking layer. For this, a blocking layer is removed from each of the source areas 130 and the drain area 140 for forming the first silicides 180 and the second silicide 190. The area in which the blocking layer was removed is deposited by a metal such as cobalt, nickel, or titanium and then is treated by heating to form the first silicides 180 and the second silicide 190.

The substrate may be formed to have a P-well tab 101 doped in a higher concentration than the P-well. The P-well tab 101 may be connected to the first metal portion 110 via a well contact or a bulk contact 103 (see FIG. 2B). The STI area 107 (or a local oxidation of silicon (LOCOS) area) may be formed to isolate the source areas 130 and the P-well tab 101.

FIG. 2B is a plan view illustrating an example of an ESD protection device of a general aspect having a first metal portion 110 and a second metal portion 120 added to the ESD protection device as illustrated in FIG. 2A. The first metal portion 110 and the second metal portion 120 may be spaced apart from a surface of a GGNMOS transistor and may be arranged in parallel in a direction perpendicular to an arrangement direction of the source areas 130, the gates 150, and the drain area 140. At this time, by a 0.18 µm CMOS design rule, the first metal portion 110 and the second metal portion 120 may be arranged spaced apart at least 0.23 µm or greater from each other on the same layer. Each of the first metal portion 110 and the second metal portion 120 may have a width in a range of 15 µm to 25 µm. However, the spacing between the first metal portion 110 and the second metal portion 120 may be changed according to various CMOS design rules.

The first metal portion 110 is connected to the ground line Vss (not illustrated), and is electrically connected to the source areas 130 via the first connecting portions 160. The second metal portion 120 is connected to an electric power line Vdd for supplying a driving voltage to a semiconductor device (not illustrated) in which the ESD protection device is used and is electrically connected to the drain area 140 via the second connecting portions 170.

In addition, the ESD stress current flows into the ESD protection device via the second metal portion 120 connected to the electric power line, and the ESD protection device can discharge the current to the ground line via the first metal portion 110.

Further, the ESD protection device of a general aspect may include an insulating layer arranged between the first metal portion 110 and second metal portion 120 and the GGNMOS transistor. The insulating layer may be formed of an insulating material including silicon oxide or silicon nitride.

In the case in which the insulating layer is formed, the first connecting portions 160 and the second connecting portions 170 may include at least one contact through the insulating layer, respectively.

In the explanation with respect to FIGS. 2A and 2B, the ESD protection device is the GGNMOS transistor; however, the ESD protection device is not limited thereto. The ESD protection device may be implemented by an N-type Metal Oxide Semiconductor (NMOS) transistor, a P-type Metal Oxide Semiconductor (PMOS) transistor, and a Gate Powered P-type Metal Oxide Semiconductor (GPPMOS) transistor.

For example, when the ESD protection device is implemented by the NMOS transistor, a gate terminal may be formed to connect to another terminal in order to prevent a channel from being formed on the NMOS transistor. In addition, if it can serve as the ESD protection device, a passive component such as a resistor, etc., may be connected between the source and gate terminals and the ground terminal.

FIGS. 2A and 2B are illustrated so that the first metal portion 110 and the second metal portion 120 are in parallel to each other and arranged in a direction perpendicular to an arrangement direction of the gates 150. However, the first metal portion 110 and the second metal portion 120 are not necessarily limited thereto. Even if the first metal portion 110 and the second metal portion 120 are spaced apart from each other, the first metal portion 110 and the second metal portion 120 may be arranged to not be parallel to each other and in a certain angle with respect to the gates 150.

FIGS. 2A and 2B are illustrated so that three first connecting portions 160 are formed in the respective source areas 130 and three second connecting portions 170 are formed in the drain area 140. However, this is only one example according to the 0.18 µm CMOS design rule. When using the silicide process, the number of each of the first connecting portions 160 and the second connecting portions 170 may be changed according to a 0.35 µm or less CMOS design rule.

In addition, FIGS. 2A and 2B are illustrated so that the first connecting portions 160 and the second connecting portions 170 have a rectangular shape; however, this is only one example. As long as each of the first metal portion 110 and the second metal portion 120 can be electrically connected to each of the first silicides 180 and the second silicide 190, the first connecting portions 160 and the second connecting portions 170 may be formed in various shapes such as a circle, another polygon, etc.

Further, FIGS. 2A and 2B are illustrated so that the first silicides 180 and the second silicide 190 have a rectangular shape; however, this is only one example. The first silicides 180 and the second silicide 190 may be formed in various shapes such as a circle, another polygon, etc., on the source areas 130 and the drain area 140.

Figure 3:
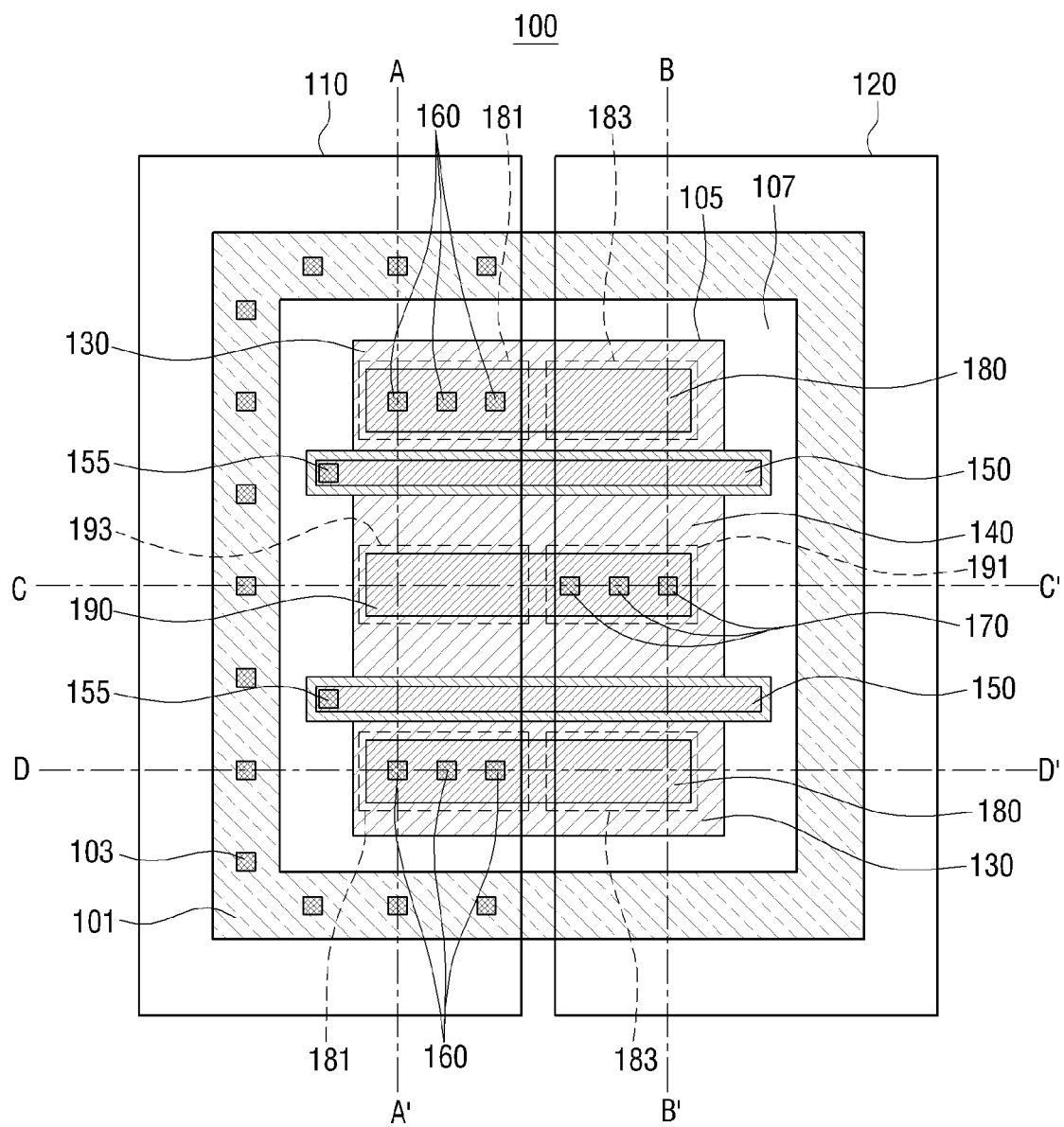
FIGS. 3 to 7 are views illustrating examples of a structure of an ESD protection device of a general aspect.
Figure 4:
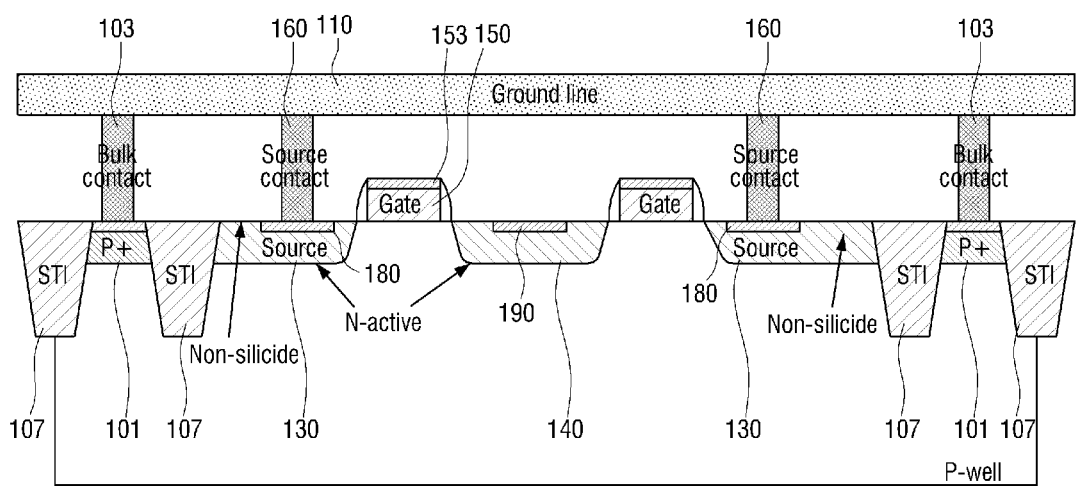
Figure 5:
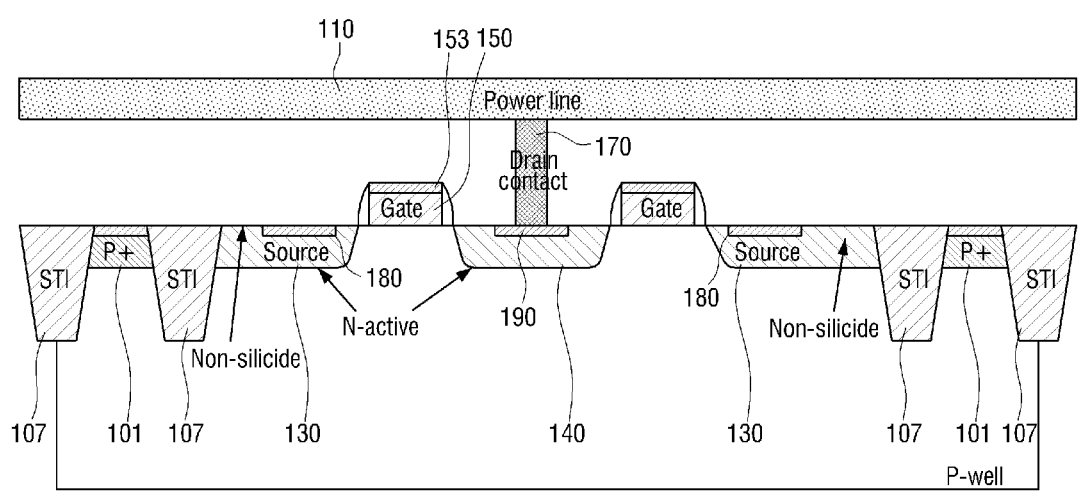
Figure 6:
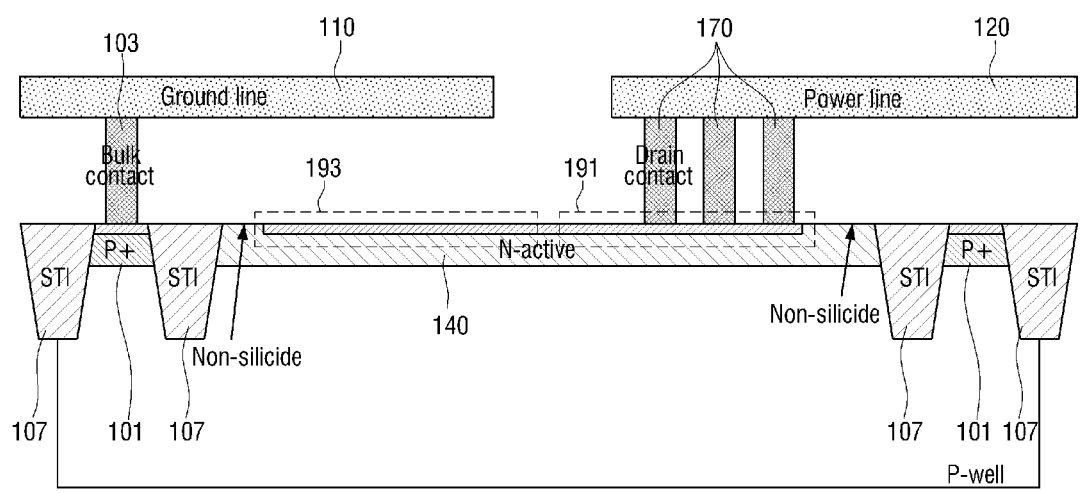
Figure 7:
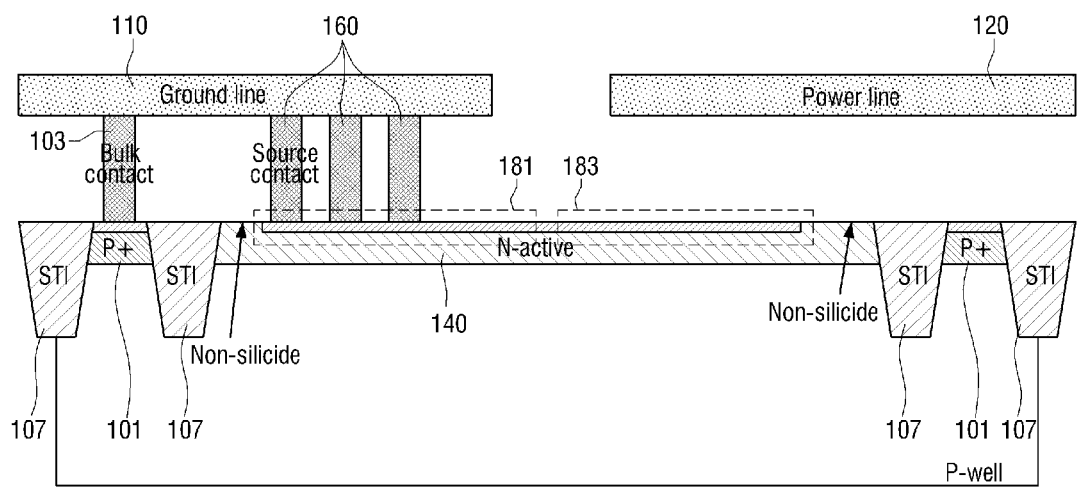

FIGS. 3 to 7 are views illustrating examples of a structure of an ESD protection device of a general aspect. FIG. 3 is the same as FIG. 2B. FIGS. 4 to 7 are sectional views illustrating examples of the ESD protection device of FIG. 3. FIG. 4 is a sectional view illustrating an example of the ESD protection device taken along a line A-A' in FIG. 3. FIG. 5 is a sectional view illustrating an example of the ESD protection device taken along a line B-B' in FIG. 3. FIG. 6 is a sectional view illustrating an example of the ESD protection device taken along a line C-C' in FIG. 3. FIG. 7 is a sectional view illustrating an example of the ESD protection device taken along a line D-D' in FIG. 3.

Referring to FIGS. 4 to 7, there are N-active areas (source areas 130 and drain area 140) and the gates 150 in the substrate doped as the p-type. That is, a P-well and the first and second silicides 180 and 190 are formed on the N-active area.

The first metal portion 110 and the second metal portion 120 are formed to be spaced apart from the substrate and they are connected to the ground line Vss (not illustrated) and the electric power line Vdd (not illustrated), respectively.

The first silicides 180 may be formed on the source areas 130 to have the source connecting areas 181 surrounding the first connecting portions 160 and the source extension areas 183 on which the first connecting portions 160 are not formed. The spacing between the first connecting portions 160 and the gates 150 is in a range of 0.11 µm to 1 µm.

Also, the first silicides 180 are connected to the first metal portion 110 via the first connecting portions 160. The first connecting portions 160 may be formed to be spaced apart as much as 0.2 µm from the perimeter of the first silicides 180.

The second silicide 190 may be formed on the drain area 140 to have an drain connecting area 191 surrounding the second connecting portions 170 and a drain extension area 193 on which the second connecting portions are not formed. The spacing between the second connecting portions 170 and the gates 150 is in a range of 1 µm to 5 µm.

In addition, the second silicide 190 is connected to the second metal portion 120 via the second connecting portions 170. The second connecting portions 170 may be formed to be spaced apart as much as 0.2 µm from the perimeter of the second silicide 190.

As described above, forming the first silicides 180 and the second silicide 190 to have the source and drain extension areas 183 and 193 serves to reduce the resistance by the silicide to form a wider current path between the source areas 130 and the drain area 140.

On the other hand, as described above, the first and second silicides 180 and 190 are formed within a predetermined area of the source areas 130 and the drain area 140, respectively. That is, there is a non-silicide area in each of the source areas 130 and the drain area 140. If an entirety of the source areas 130 and the drain area 140 is silicided, a multi finger trigger is not generated and an efficiency of characteristic compared to the area is decreased.

As such, the second silicide 190, more so than the first silicides 180 may be formed far away from the gates 150 since the ESD stress current enters the drain area 140 in which the second silicide 190 is formed. Due to this, high robustness is achieved, NPN (or PNP) of a neighboring finger can be constantly turned on by the ballasting resistance.

The gates 150 are connected to the first metal portion 110 via the gate contacts 155. A silicide 153 may be formed on the gates 150 in order to decrease contact resistance with the gate contacts 155.

The P-well tab 101 is connected to the first metal portion 110 via a well-contact or bulk contact 103 and may be isolated from the source areas 130 by the STI area (or LOCUS area) 107. As illustrated in FIG. 2B, the gate contacts 155, the first connecting portions 160 for the source contact, and the P-well contacts 103 may be connected to the ground line via the first metal portion 110. Therefore, an ESD protection device for a GGNMOS is formed.

On the other hand, since the first metal portion 110 and the second metal portion 120 are arranged on the same layer, the minimum distance therebetween should be 0.23 µm or greater in the 0.18 µm CMOS design rule. Since the first metal portion 110 and the second metal portion 120 are used as a ground terminal or an electric power terminal, the width thereof may be approximately in a range of 15 µm to 25 µm.

However, these values are only one example in the 0.18 µm CMOS design rule, and can be changed in 0.3 µm to 0.35 µm CMOS design rule.

Figure 8:
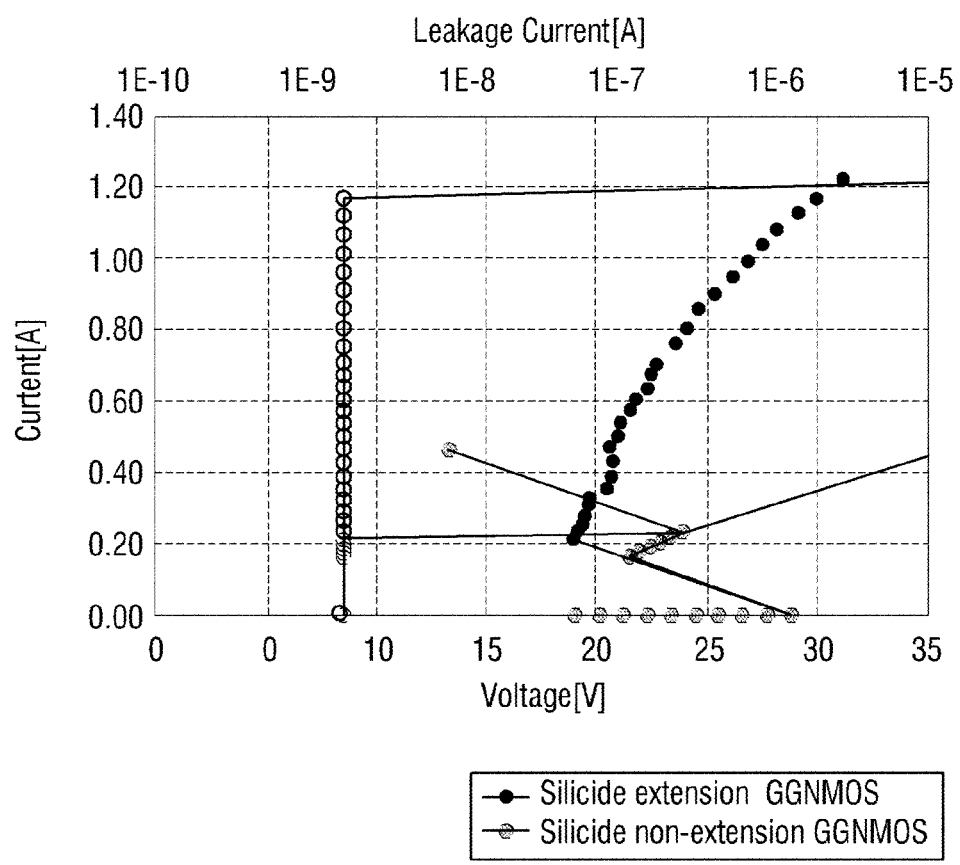
FIG. 8 is a graph illustrating an example of a measuring result of an ESD protection device of a general aspect.

FIG. 8 is a graph illustrating an example of a measuring result of an ESD protection device of a general aspect. For this, Transmission Line Pulse (TLP) of the GGNMOS is measured. The silicide non-extension GGNMOS represents a result of a case that the silicide is formed on only some areas of each of the source and drain. The silicide extension GGNMOS represents a result of a case that the silicide is extended to a portion on which the first connecting portions 160 and the second connecting portions 170 do not exist in a general aspect.

Referring to FIG. 8, it is found that when the silicide is formed on the source and drain connecting areas 181 and 191 (the silicide non-extension GGNMOS), a degradation of an ESD characteristic occurs. This is because the BJT current path is formed only in some of the area.

However, it is found that when the silicide area is extended to the source and drain extension areas 183 and 193 on which the first connecting portions 160 and the second connecting portions 170 do not exist (the silicide extension GGNMOS), a degradation of the ESD characteristic does not occur.

Figure 9A:
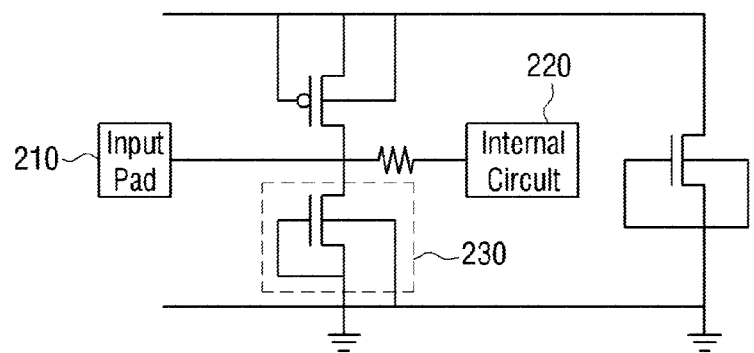
FIG. 9A is a circuit diagram illustrating an example of an operation of an ESD protection device of a general aspect.

FIG. 9A is a circuit diagram illustrating an example of an operation of the ESD protection device 230 of a general aspect and illustrates the ESD protection device 230 embodied by the GGNMOS.

When an external ESD stress current comes in from an input pad 210, due to high resistance in front of an internal circuit, the ESD stress current passes through the ESD protection device 230. Then, the current enters the drain area of the GGNMOS, and the current passes through the well area and flows to the bulk or source area. After that, the current goes to the ground line connected by the source contact and the high current does not flow into the internal circuit, thereby protecting the internal circuit. In other words, the circuit can discharge the ESD stress current outside the semiconductor device.

Figure 9B:
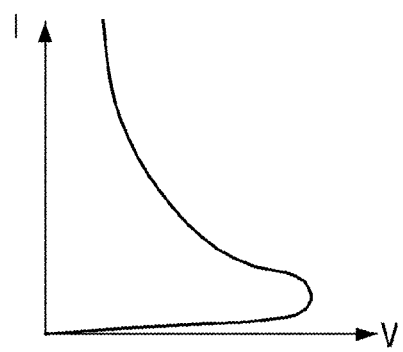
FIG. 9B is a graph illustrating an example of a relationship between voltage and current when an ESD protection device is embodied by a GGNMOS.

FIG. 9B is a graph illustrating an example of a relationship between voltage and current of an ESD protection device when the ESD protection device is embodied by a GGNMOS. Here, the ESD stress current is determined using a TLP copying a Human Body Model (HBM) as an evaluation base. That is, since when in the HBM a voltage of 2000 V is applied, a peak current is in the range of 1.2 A to 1.48 A and the ESD stress current may be determined in the range of 1.2 A to 1.48 A.

Figure 10:
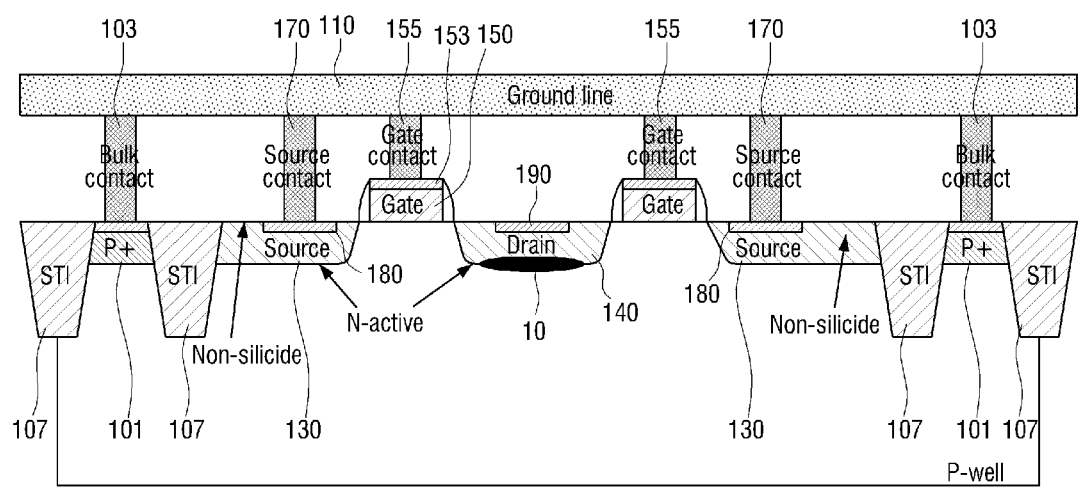
FIG. 10 is a sectional view illustrating an example of an ESD protection device of another general aspect.

FIG. 10 is a sectional view illustrating an example of an ESD protection device of another general aspect.

As illustrated in FIG. 10, the ESD protection device may include an implant area 10 that is formed by implanting a different type of dopant from the drain area below the drain area. In other words, the ESD protection device may include a p-type of ESD implant 10 opposite to the dopant type (n-type) of the drain area. This is the only differentiation between the ESD protection device of FIG. 10 and the ESD protection device of FIGS. 1 to 7.

The implant area 10 is formed to implant ions in a boundary surface between the drain area and the P-well. Some portion of a PN junction area formed by the drain and the P-well enters an edge of the drain so as to form a path which can quickly transmit the ESD stress current flowing in the edge of the drain to the Si-substrate. Therefore, the implant 10 provides an effect of spreading the ESD stress current to many areas, thereby improving the ESD characteristic.

The technical features of the ESD protection device according to FIGS. 1 to 7 can be equally applied to the ESD protection device of FIG. 10; therefore, repeated descriptions thereof will be omitted.

Figure 11A:
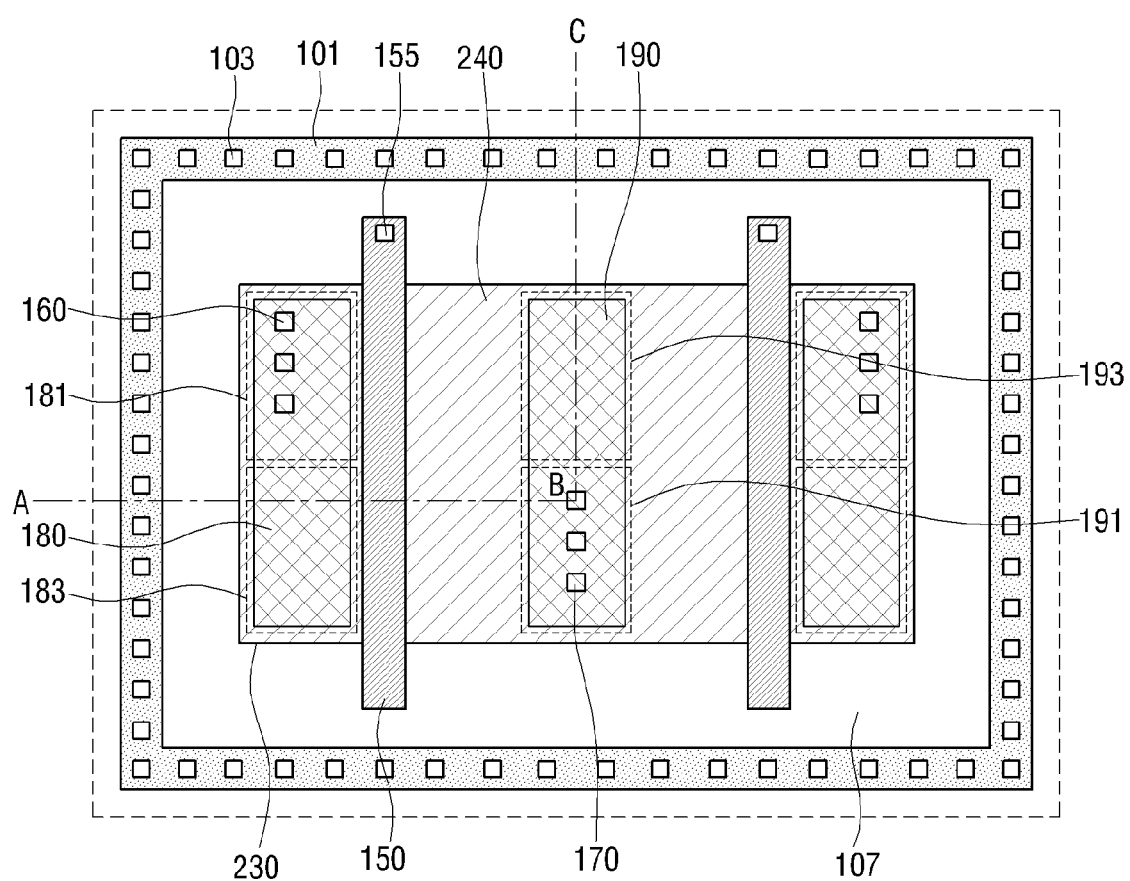
FIGS. 11A to 12B are views illustrating examples of an ESD protection device of another general aspect.
Figure 11B:
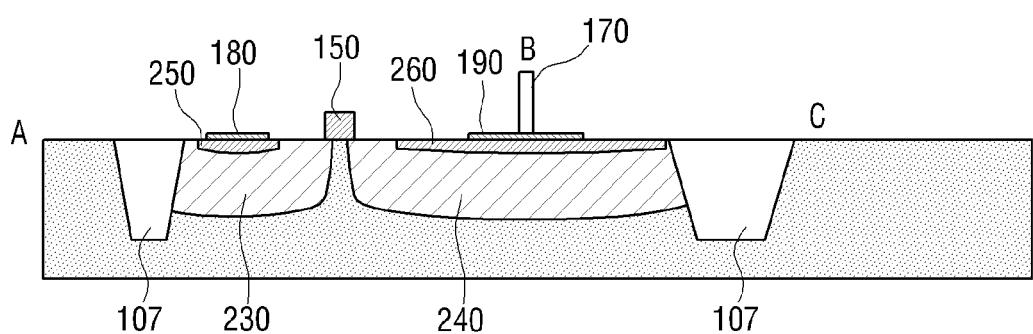

FIGS. 11A to 12B are views illustrating examples of an ESD protection device of another general aspect. FIG. 11A is a plan view illustrating an example of a high voltage GGN-MOS. FIG. 11A further illustrates that a structure used as a high voltage device can be used as the ESD device as it is. FIG. 11B is a sectional view illustrating an example of the high voltage GGNMOS of FIG. 11A taken along a line A-B-C. Here, the high voltage area is in a range of 9 V to 40 V, and, for example, 9 V, 13.5 V, 20 V, 30 V and 40 V etc. may be included.

In this aspect, for the edge of the drain to have a large ballast resistance, spacing between the gates and the drain should be larger than spacing between the gates and the sources. For convenience of explanation, metal lines are not illustrated. Repeated explanations with respect to the same reference numbers as those illustrated in FIGS. 2A and 2B will be omitted. However, the source areas 130 and the drain area 140 illustrated in FIGS. 2A and 2B may be related to the source area 250 and the drain area 260 illustrated in FIGS. 11B and 12B.

For example, the first silicides 180 may include the source connecting areas 181 surrounding the first connecting portions 160, and the source extension areas 183 in which the first connecting portions 160 are not formed. Similarly, a second silicide 190 may include a drain connecting area 191 surrounding the second connecting portions 170 and a drain extension area 193 in which the second connecting portions 170 are not formed. In other words, the first silicides 180 are formed to extend to the source extension areas 183 facing the second connecting portions 170 on the source areas, and the second silicide 190 is formed to extend to the drain extension area 193 facing the first connecting portions 160 on the drain area.

Unlike the above described low-voltage ESD protection device, the high voltage ESD protection device includes low-concentration drift areas 230 and 240 that are formed below a high-concentration source area 250 and a high-concentration drain area 260 by low-concentration impurity doping, respectively.

For example, each of the low-concentration drift areas 230 and 240 may be formed to surround each of the high-concentration source and drain areas 250 and 260. The low-concentration drift areas 230 and 240 are formed by the same type of dopant as that of the high-concentration source/drain areas 250 and 260.

The low-concentration drift areas 230 and 240 may reduce an electric field by a low-concentration effect to increase a breakdown voltage comparatively, as there only exists the high-concentration source and drain.

The low-concentration drift areas 230 and 240 may be formed by ion-implantation of n-type dopants and a drive-in annealing at 1000° C. or greater. Due to high temperature annealing, a depth thereof may be greater than a depth of the high-concentration source/drain area and greater than a height of the gates 150.

The low-concentration drift areas 230 and 240 are formed before the gate structure is formed. Therefore, the low-concentration drift areas 230 and 240 have a structure different from the Lightly Doped Drain (LDD), which is formed after the gate is formed. Since the LDD structure has a depth that is less than the height of the gates, it is able to relieve the electric field in a horizontal direction, but is insufficient to relieve the electric field in a vertical direction. On the other hand, the widely formed low-concentration drift structure helps to relieve the electric field in the vertical direction.

Figure 12A:
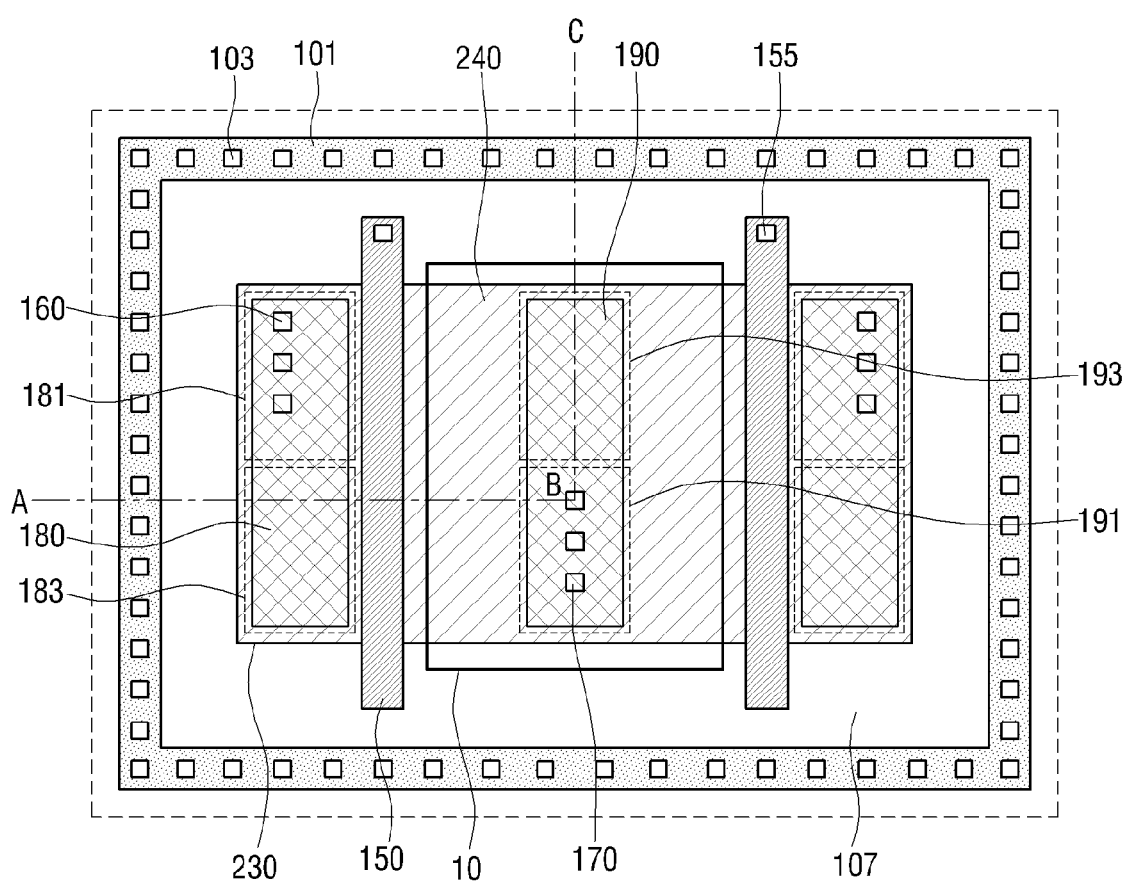
Figure 12B:
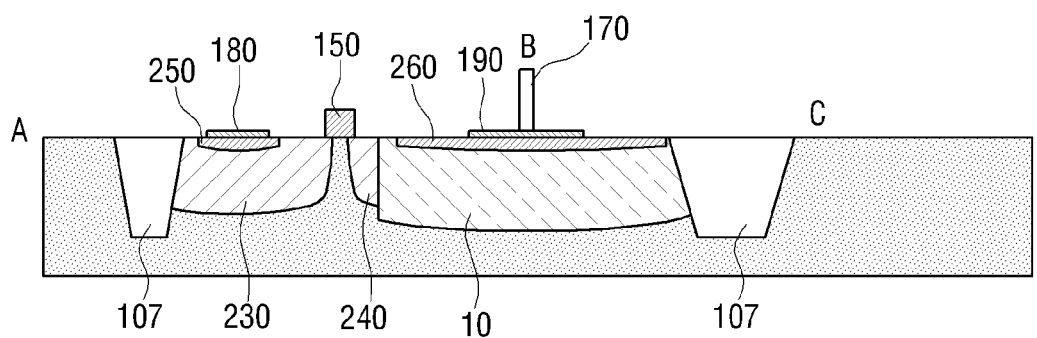

In addition, FIG. 12A is a plan view illustrating an example of a high voltage GGNMOS including a logic well implant area 10 which is formed to implant a dopant into the low-concentration drift areas 240 in the high voltage GGNMOS as illustrated in FIG. 11A. FIG. 12B is a sectional view illustrating an example of the high voltage GGNMOS of FIG. 12A taken along a line A-B-C.

Like the above-described general aspects, the first silicides 180 may include the source connecting areas 181 surrounding the first connecting portions 160 and the source extension areas 183 in which the first connecting portions 160 are not formed. Similarly, the second silicide 190 may include the drain connecting area 191 surrounding the second connecting portions 170 and the drain extension area 193 in which the second connecting portions 170 are not formed. In other words, the first silicides 180 are formed to extend to the source extension areas 183 facing the second connecting portions 170 on the source areas, and the second silicide 190 is formed to extend to the drain extension area 193 facing the first connecting portions 160 on the drain area.

The logic well implant area 10 is added to prevent the breakdown generation from the surface and form a current flow from the drain to Si-substrate. As a result, the current is formed on a broad area so that a thermal breakdown is not generated from the surface of the Si-substrate.

Here, the logic well implant area 10 may be formed by the n-well implant process that is used to form a logic device. Therefore, a dose concentration may be the same as or greater than that of the previously formed low-concentration drift areas 230 and 240. As illustrated in FIG. 12B, the logic well implant area 10 has a depth that is greater than a depth of the low-concentration drift areas 240 and less than a depth of the STI area 107. The logic well implant area 10 has an area that is overlapped with the low-concentration drift area 240 and completely wraps the drain area 260.

The logic well implant area 10 can be formed as a conventional well structure formed by implant and drive-in annealing or a retrograde well structure. The retrograde well structure is formed by performing ion implantation of impurities into the low-concentration drift areas 240 using different energies in multiple steps in dosing several times. A method for forming the low-concentration drift area was described in FIGS. 11A and 11B; therefore, an explanation thereof will be omitted.

According to teachings above, there is provided a high voltage GGNMOS and a high voltage GPPMOS including an n-type ESD implant area as an ESD protection device that may protect an internal circuit thereof from outside static electricity since an ESD stress current is discharged outside of a semiconductor device.

A number of examples have been described above. Nevertheless, it will be understood that various modifications may be made. For example, suitable results may be achieved if components are combined in a different manner and/or replaced or supplemented by other components or their equivalents. Accordingly, other implementations are within the scope of the following claims.

What is claimed is:

1. An Electro-Static Discharge (ESD) protection device, comprising:
a metal-oxide semiconductor (MOS) transistor, comprising:
a source area having a surface on which a first silicide is formed, the source area comprising:

a source connecting area comprising a first connecting portion formed on the first silicide; and
a source extension area;
a gate arranged in parallel with the source area; and
a drain area arranged in parallel with the source area and the gate, the drain area having a surface on which a second silicide is formed, the drain area comprising:
a drain connecting area formed opposite the source extension area, the drain connecting area comprising second connection portion formed on the second silicide; and
a drain extension area formed opposite the source connecting area,
wherein the ESD protection device is configured to protect an internal circuit from ESD.

2. The ESD protection device of claim 1, further comprising:
a first metal portion and a second metal portion that are spaced apart from a surface of the MOS transistor and arranged in parallel in a direction perpendicular to an arrangement direction of the source area, the gate and the drain area,
wherein the first connecting portion is connected to the first metal portion and the second connecting portion is connected to the second metal portion.

3. The ESD protection device of claim 2, wherein the first metal portion is connected to a ground line, and the second metal portion is connected to an electric power line from which an ESD stress current is flowed in.

4. The ESD protection device of claim 2, wherein the first metal portion and the second metal portion are spaced apart from each other.

5. The ESD protection device of claim 2, wherein the first metal portion and the second metal portion are arranged on the same layer.

6. The ESD protection device of claim 1, wherein each of the first connecting portion and the second connecting portion comprises at least one contact through an insulating layer.

7. The ESD protection device of claim 1, wherein:
the first silicide has a first predetermined size based on a center of the source area, a portion of the source area being exposed from a boundary of the source area; and
the second silicide has a second predetermined size based on a center of the drain area, a portion of the drain area being exposed from a boundary of the drain area.

8. The ESD protection device of claim 1, wherein a spacing between the second connecting portion and the gate is greater than a spacing between the first connecting portion and the gate.

9. The ESD protection device of claim 1, wherein:
the first connecting portion is spaced apart in a range of 0.11 μm to 1 μm from the gate; and
the second connecting portion is spaced apart in a range of 1 μm to 5 μm from the gate.

10. The ESD protection device of claim 1, wherein the MOS transistor comprises a gate-grounded NMOS transistor.

11. The ESD protection device of claim 1, wherein the MOS transistor comprises a high voltage gate-grounded NMOS transistor.

12. The ESD protection device of claim 11, further comprising:
a first low-concentration drift area formed below the drain area; and
a second low-concentration drift area formed below the source area.

13. The ESD protection device of claim 12, further comprising:
a logic well implant area being implanted below the drain area such that the logic well implant area implants a dopant into the first low-concentration drift area that has a depth that is greater than a depth of the first low-concentration drift area.

14. The ESD protection device of claim 13, wherein the logic well implant area comprises a retrograde well.

15. The ESD protection device of claim 1, wherein the MOS transistor comprises a multi-finger structure including at least two gates.

16. The ESD protection device of claim 1, wherein the gate comprises a silicide area formed on the gate.

17. The ESD protection device of claim 1, wherein:
the first connecting portion is one of a plurality of first connecting portions, the first connecting portions being connected to the first metal portion; and
the second connecting portion is one of a plurality of second connecting portions, the second connecting portions being connected to the second metal portion.

18. An Electro-Static Discharge (ESD) protection device, comprising:
a metal-oxide semiconductor (MOS) transistor having a source area, a gate, and a drain area arranged in parallel;
a first silicide formed on a surface of the source area;
a second silicide formed on a surface of the drain area;
a first connector formed on the first silicide; and
a second connector formed on the second silicide such that the second connector is free from facing the first connector,
wherein:
the first silicide extends to a source extension area on the source area that faces the second connector; and
the second silicide extends to a drain extension area on the drain area that faces the first connector.

19. The ESD protection device of claim 18, wherein the ESD protection device is configured to protect an internal circuit from ESD.

* * * * *